United States Patent [19]

Cogan et al.

[11] Patent Number: 4,824,489

[45] Date of Patent: Apr. 25, 1989

[54] ULTRA-THIN SOLAR CELL AND METHOD

[75] Inventors: George W. Cogan; Lee A. Christel, both of Menlo Park; J. Thomas Merchant, Los Gatos; James F. Gibbons, Palo Alto, all of Calif.

[73] Assignee: Sera Solar Corporation, Santa Clara, Calif.

[21] Appl. No.: 151,392

[22] Filed: Feb. 2, 1988

[51] Int. Cl.$^4$ .................. H01L 31/06; H01L 31/18
[52] U.S. Cl. .................................. 136/256; 136/259; 136/261; 437/2; 437/19; 437/173
[58] Field of Search ............... 437/2, 16, 19, 173, 437/203, 929; 136/261, 256, 259

[56] References Cited

U.S. PATENT DOCUMENTS 4,468,853  9/1984  Morita et al. ........................ 437/2
4,673,770  6/1987  Mandelkorn ...................... 136/259

OTHER PUBLICATIONS

F. Ho et al, *Conference Record, 15th IEEE Photovoltaic Specialists Conf.* (1981), pp. 102–106.

*Primary Examiner*—Aaron Weisstuch
*Attorney, Agent, or Firm*—Flehr, Hohbach, Test

[57] ABSTRACT

A method for processing solar cells, and particularly thin solar cells is disclosed. The method contemplates processing the front surface of the cell on a wafer of normal thickness. A transparent substrate is adhered to the front of the processed cell. The bulk semiconductor layer is then thinned to the desired thickness. An amorphous doped semiconductor material is applied to the back surface of the thinned wafer and exposed to pulsed laser energy having a duration and intensity long enough to melt the amorphous material, but short enough to prevent thermal damage to the bondline. A back surface dielectric, backside contact mask and back surface reflector metal complete the cell.

12 Claims, 3 Drawing Sheets

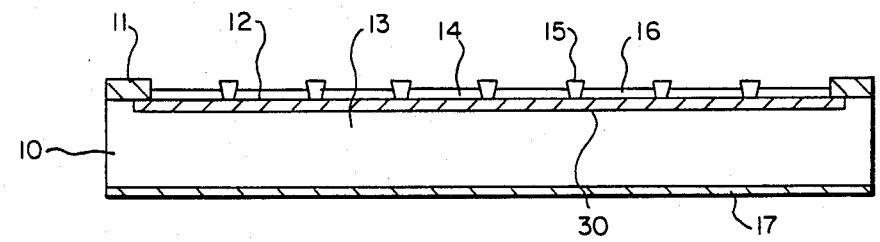
FIG.—1
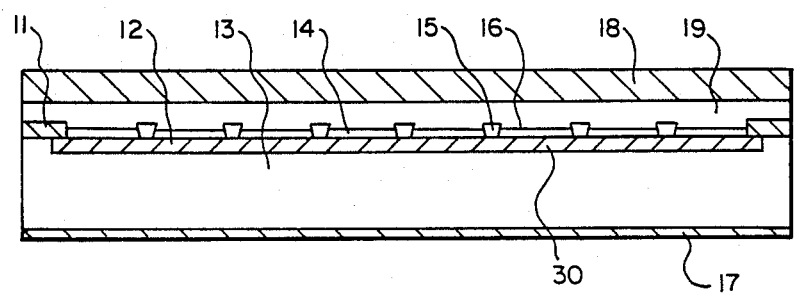
FIG.—2
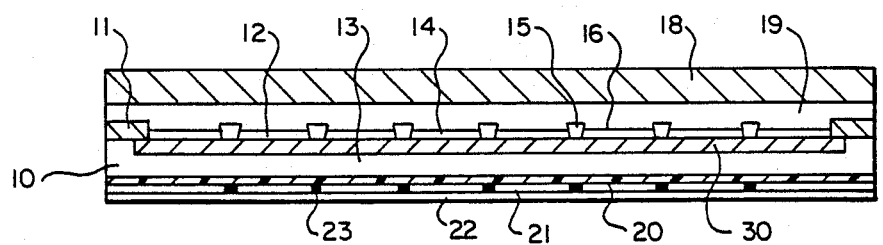
FIG.—4

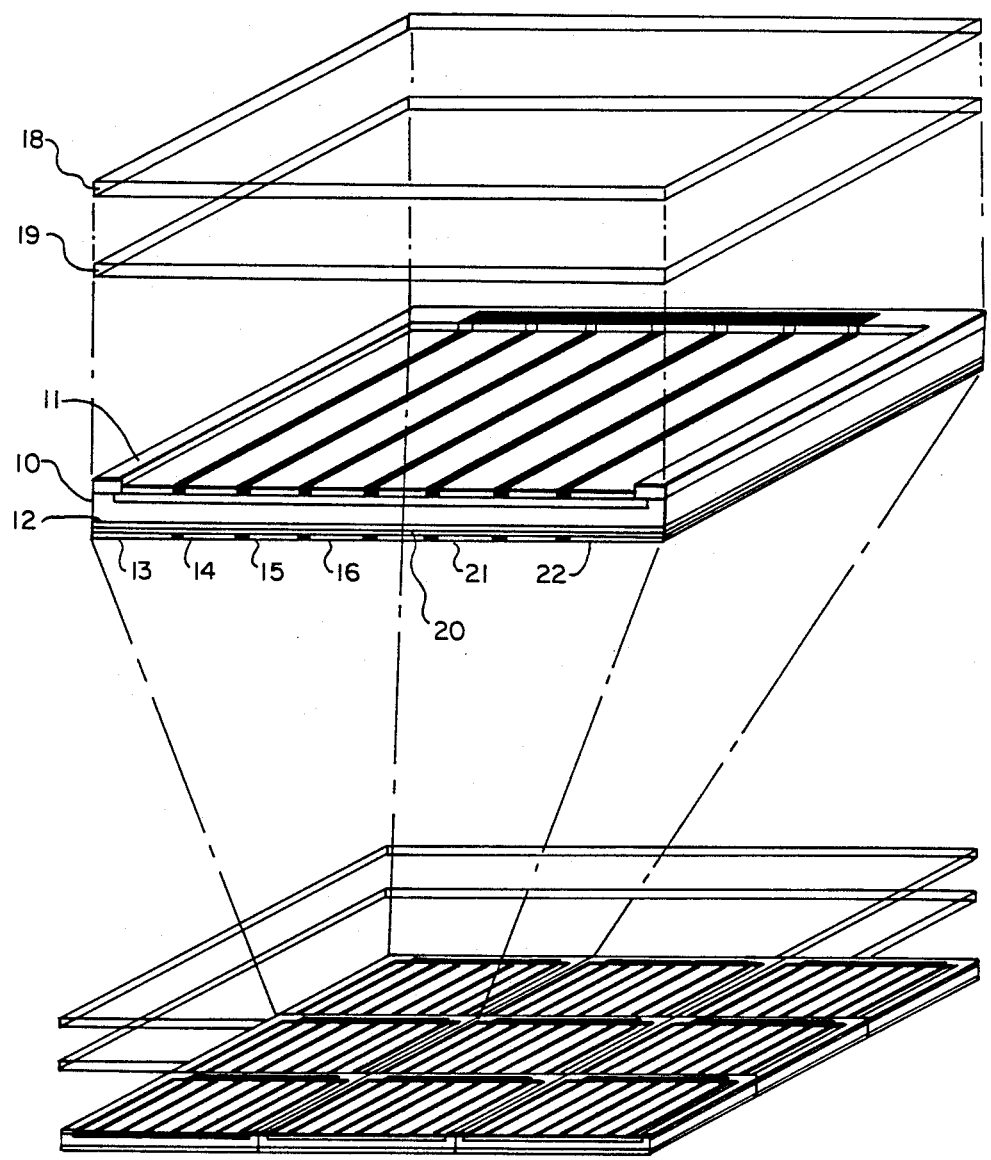
FIG.—5

ULTRA-THIN SOLAR CELL AND METHOD

This invention was made with government support under JPL Contract No. 957710 and is a subcontract under NASA Contract NAS 7-918 Task Order No. RE-156/200. The government has certain rights in this invention.

The present invention relates generally to solar cells fabricated from semiconductor materials. More particularly, the invention relates to a process for producing extremely thin solar cells having desirable radiation resistance and efficiency characteristics.

Particularly in space power applications, there is a need for thinly fabricated solar cells. Spacecraft rely almost exclusively on photovoltaic cells for their electric power generation. Solar cells suitable for space power applications must be light in weight, while maintaining high efficiency and good radiation resistance. To reduce weight, it is desirable to fabricate solar cells from semiconductor materials such as silicon, which have been thinned to a thickness of less then 100 microns. Such cells have several advantages over the traditional thicker cells which often exceed 300 microns. For example, the reduced weight of thin cells decreases the cost of launching the spacecraft into orbit.

A critical solar cell design parameter is the ratio of diffusion length to cell thickness, $L_p/t$. In a conventional cell, with a planar diffusion on the front surface of a dopant type opposite to that of the bulk, carrier pairs (electrons and holes) are generated throughout the device and must diffuse to the front and back surfaces where they are collected. Any recombination within the confines of the semiconductor material lowers the collected current and the output voltage. Of course, this leads to lower conversion efficiencies. Theory predicts that when the ratio $L_p/t$ is significantly greater than 1, the recombinations and losses are minimized. Thus, such a solar cell will collect a high percentage of the total carriers generated. If the total carrier generation is assumed to be the same for both thinner and thicker cells, a thinner cell with the same diffusion length as a thicker cell will collect a larger fraction of the total carriers generated and thus will have a higher efficiency due to lower recombination.

Thin cells are also less susceptible to radiation damage. Improved radiation resistance lengthens the cell's useful life. The improved radiation resistance characteristics stem from the fact that radiation damage tends to reduce a cell's diffusion length, thereby reducing efficiency. Therefore, given comparable starting efficiencies, a thinner cell has an intrinsic radiation resistance advantage over thicker cells.

Generally, thin solar cells known to the prior art have been formed by thinning a silicon wafer to a desired thickness, processing the wafer into a solar cell, and finally bonding the formed cell to a cover glass which provides support. Such a fabrication method has several drawbacks. To begin with, wafers processed in the thin state are substantially more delicate than standard wafers and therefore require special handling and are more susceptible to breakage. Using single crystal silicon as an example, it is well known that wafers thinner than 50 microns are difficult to handle and break readily both during and after fabrication. Further, such wafers are expensive to produce, typically costing ten times more than standard wafers.

Another drawback of thin cells has been that the absorption of light is often strongly correlated to the cell's thickness. In the case of silicon, which is an indirect bandgap material, several hundred microns are generally required to absorb all of the useful incoming light. Thus, it is necessary to apply a reflective coating to at least the bottom surface of the wafer.

Accordingly, an objective of the present invention is to provide a method for fabricating ultra-thin solar cells having improved resistance to breakage both during and after fabrication.

Another objective of this invention is to present a method for the fabrication of a solar cell with improved radiation resistance and efficiency.

Yet another object of this invention is to provide a method for introducing dopants into the surface of a semiconductor device while it is mounted to a substrate without damaging the substrate or the adhesive which bonds the device thereto.

To achieve the foregoing and other objects and in accordance with the purpose of the present invention, a method of fabricating a solar cell from a semiconductor wafer is presented. Specifically, in a preferred aspect of the invention, standard front surface processing of the semiconductor wafer is carried out on a normal, thick (for example, 350 micron) wafer. After the front surface of the wafer has been processed, the front surface of the wafer is bonded to a transparent substrate forming a bond between the transparent substrate and the wafer. The bulk semiconductor layer is then thinned. After thinning the back surface is processed to provide an ohmic contact, to reduce the effect of back surface recombination, and to provide a back surface reflector.

The back surface processing includes depositing a layer of amorphous material containing an appropriate dopant on the bottom surface of the thinned bulk semiconductor layer to form an ohmic contact and back surface field. The amorphous layer is then exposed to pulsed laser energy. The energy pulses are long enough to melt the amorphous material and a thin layer of semiconductor material beneath it, but are short enough to prevent thermal damage to the bondline. The remainder of the back surface processing may then be finished. Preferably, the back surface processing includes the addition of a dielectric, a masking step to form openings to the semiconductor through the dielectric, and the addition of a metallic layer which acts both as a back surface reflector and a terminal contact.

The features of the present invention that are believed to be novel are set forth with particularity in the appended claims. The invention, together with further objects and advantages thereof, may best be understood by reference to the following description taken in conjunction with the accompanying drawings in which:

FIG. 1 is a sectional side view of a solar cell that has its front surface formed in accordance with standard techniques.

FIG. 2 is a sectional side view of the solar cell shown in FIG. 1 after the addition of the coverglass.

FIG. 4 is a sectional side view of a completed solar cell processed in accordance with the teachings of the present invention.

FIG. 5 shows an exploded cut-away perspective view of a solar cell, including a coverglass and processed in accordance with the present invention.

Figure 3:
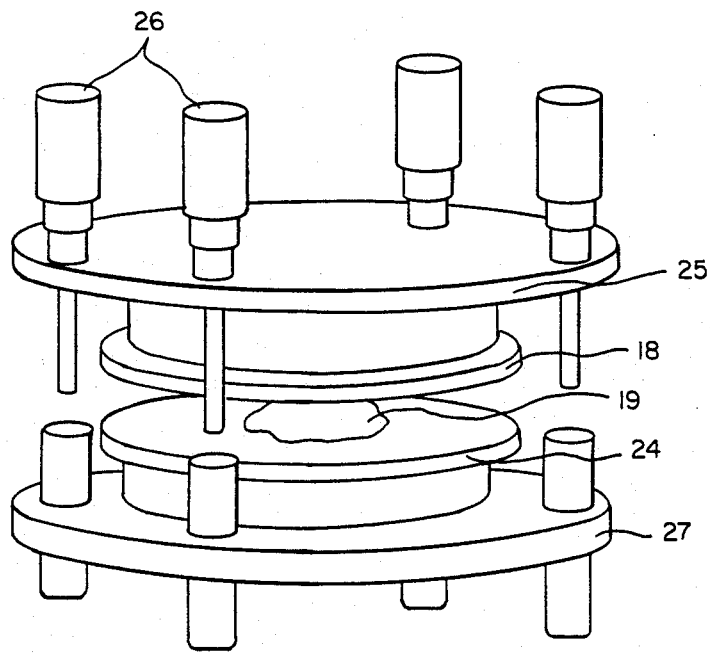
FIG. 3 is a perspective view of a bonding apparatus suitable for securing a coverglass to a semiconductor wafer.

In the cell fabrication method preferred for use in conjunction with the teachings of the present invention, processing is carried out on a normal thick (for example, 350 micron) wafer 10. After the wafer 10 has been processed, it is bonded to a transparent superstrate 18 as shown in FIG. 2. The wafer 10 is then thinned to a desired thickness by grinding, lapping and/or etching of the back surface. The superstrate provides support during the thinning process. After the semiconductor material has been thinned, the back surface damage is reduced by polishing and/or etching.

After the back surface has been polished and/or etched to remove residual damage, it is coated with an amorphous doped semiconductor material which in conjunction with the laser processing techniques described below will allow the introduction of a back surface field and an ohmic contact to the cell. As will be appreciated by those skilled in the art, a key consideration in such a process is to prevent certain cell components, such as the superstrate adhesive 19 from exposure to excess temperatures (such as temperatures greater than 150° C.) even for short periods of time. Therefore, a layer of amorphous material containing the chosen dopant is applied at low temperatures to the back surface of the thin bulk layer. The amorphous material along with a portion of the back surface is then melted using energy from a pulsed laser source. During the melting and regrowth of the crystal layer, the dopant is incorporated into the bottom surface of the wafer. The intensity of the pulse laser source is chosen such that it allows melting of a shallow region of the back surface without significant heating through the sample to the adhesive bondline. After laser processing, a dielectric layer, and a back surface reflector are deposited to form the back surface of the solar cell.

FIG. 1 represents a section of a solar cell after the first stage of processing has been completed. Standard solar cell processing techniques are used for the first stage of processing. A normal thickness wafer 10 is used so that handling does not result in excessive breakage. By way of example, in a cell formed of a single crystal of p-type silicon semiconductor wafer 10 an oxide layer 11 is grown or deposited on the front surface of the wafer 10. Openings in the oxide layer 11 are then defined to allow a n-type front surface layer 12 to be formed using standard doping processes. A junction 30 is formed where front surface layer 12 and the bulk layer 13 of wafer 10 meet. Although it is contemplated that the polarities of front surface layer 12 and bulk layer 13 could be reversed, to enhance radiation resistance, it is preferable that the bulk layer 13 be p-type with a resistivity greater than 7 ohm-cm. At this point, the front surface of the cell may be passivated by growing a thin layer of oxide. Photolithography techniques are then used to open contacts in this oxide layer. A metal interconnect layer 15 is then applied to the front surface of wafer 10 to provide an electrical contact. The interconnect layer may be etched to form a contact grid of fingers that overlies the oxide layer 11 and the contact opening to provide an ohmic contact for front surface layer 12, as can best be seen with reference to FIG. 5. An anti-reflection coating 16 is then applied to cover the exposed portions of the front surface layer 12. By way of example, the anti-reflection coating 16 may be a layered structure formed of $Ta_2O_5$ and $Al_2O_3$. If a quality control testing step is desired, a metal layer 17 can be applied to the bottom of the bulk layer to provide a second contact. By way of example, a suitable material to form the testing contact is sintered aluminum.

FIG. 2 depicts a cross sectional view of the device after the second stage of processing. In the second stage of processing, an adhesive 19 is used to adhere a cover glass 18 to the front surface of the composite cell. When fabricating a solar cell to be used in a space environment, the cover glass material should be space qualified to resist radiation damage. By way of example, the coverglass 18 may be formed of a ceria doped microsheet, fused silica or other suitable glass. Various conventional coatings may be applied to one or both sides of the coverglass 18 to improve its transmission characteristics and to reflect unwanted ultraviolet radiation. The adhesive 19 which forms a bondline between coverglass 18 and the front surface 14 of the processed cell, should be formed of a clear material not particularly susceptible to degradation by ultraviolet light. By way of example, suitable materials include FEP Teflon TM, available from Saunders Corp. of Los Angeles, Calif., Dow Corning 93-500 Elastomer, available from Dow Corning Corp. of Greensboro, N.C. or other suitable materials. Alternatively, adhesiveless schemes such as electrostatic bonding or chemical vapor deposition of the coverglass material could be used.

FIG. 3 shows one possible method for bonding the coverglass 18 to the solar cell. The cell 24 is placed on a vacuum chuck 27 with precise flatness. In this embodiment, the cell 24 must be flat and parallel to at least the final precision required for the device. By way of example, an appropriate adhesive is a silicon elastomer. The coverglass 18 is placed on a similar vacuum chuck 25. The adhesive 19 is then applied to the cell 24 and the two vacuum chucks 25 and 27 are brought together with precision control supplied by micrometers 26. The adhesive is allowed to cure and the bonded wafer is removed from the vacuum chucks 25 and 27.

After being mounted to the coverglass 18 for support, the cell is thinned from the back side. The bulk layer 13 of the cell is thinned using chemical, or mechanical processes or a combination of both techniques. In a preferred embodiment for single crystal silicon devices, a combination of techniques is employed. By way of example, a wafer may be thinned from its original thickness of 300–400 microns to 100 microns using a conventional silicon wafer grinding process in conjunction with a polishing method.

The polishing process involves close control over uniformity. One possible way to achieve uniformity is to employ a vacuum mounting scheme so that the wax commonly used in this operation is eliminated. A machineable ceramic such as MACOR TM available from San Jose Delta Association of Santa Clara, Calif., makes a suitable vacuum chuck since it will not warp under the thermal stress of the polishing operation. Using a vacuum chuck, it is possible to achieve uniformity to ±3 microns across a 3 inch wafer.

Chemical etchants are then used to further thin the wafer to its final thickness of 20-50 microns. The wafer is first etched in an aqueous KOH solution (30% by weight) at 80° C. until the desired thickness is achieved. The etch rate for silicon in this solution is about 1.5 microns per minute. Then the device is further etched in 1:100 $HF:HNO_3$ to remove 1000-2000 Å and provide a clean surface.

FIG. 4 shows a sectional side view of the device after its third and final processing stage. The third processing stage includes back surface processing which occurs after thinning. The back surface processing includes several steps to provide an ohmic contact, to reduce the effective back surface recombination, and to provide a back surface reflector. An ohmic-contact dopant region 20 is formed using a pulsed laser processing sequence, and the back surface reflector is formed by first depositing a layer of dielectric material 21 at low temperatures followed by the depositing of a reflective metal 22 such as aluminum. Contact holes 23 are provided through the dielectric material 21 so that the reflecting metal 22 also serves as an electrical contact to the cell. A key consideration is that some components of the cell such as the coverglass adhesive cannot be exposed to temperatures greater than 150° C. even for short periods of time. In order to accomplish the processing without damaging the cell components, a new method of introducing dopant is described.

More particularly, the doped region 20 is formed by depositing a layer of amorphous material containing the chosen dopant on the back surface of the thinned bulk layer 13. The amorphous material together with an extremely thin portion of the bulk layer 13 is melted using energy from a pulsed laser source. During the melting and regrowth of the crystal, the dopant is incorporated into the silicon. Since the pulsed laser allows melting of a shallow region (3000-5000 Å) without significant heating through the sample, the adhesive bondline 19 remains unaffected by the processing sequence. This method has an advantage over conventional ion implantation and pulsed laser annealing techniques since it does not introduce damage to the cell below the melt depth as occurs when traditional ion implantation is employed. Such damage can be a significant source of carrier recombination, and hence efficiency loss.

Figure 6:
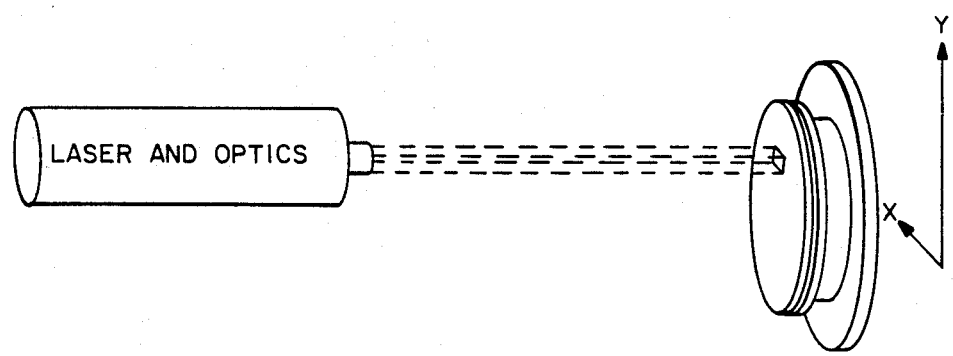
FIG. 6 is a schematic view of a laser annealing apparatus suitable for use in the present invention.

In a preferred embodiment, boron is the dopant used to introduce the back surface field and the ohmic contact to the cell. The back surface of the thinned cell is initially coated with a plasma-deposited layer of amorphous silicon:boron alloy 50-500 Å thick. Preferably the boron content is in the range of 20 to 50% by weight. The back surface is then exposed to pulsed laser energy in the range of 1-3 Joules/cm$^2$ from either an excimer or a Nd:YAG laser source, as shown in FIG. 6. The wafer is mounted to a moving vacuum chuck which steps after each laser pulse until the entire surface has been processed. The laser energy is chosen to be higher than the amorphous material's melt threshold, but low enough to prevent excessive damage to the underlying silicon. The pulse duration must be sufficiently short to prevent the adhesive bondline 19 from heating. By way of example, a 30-micron-thick silicon cell mounted with silicone elastomer as the adhesive 19 survives a 50 nanosecond excimer laser pulse at an energy density of 2 Joules/cm$^2$. An excimer laser suitable for this work is produced and sold by General Dynamics Laser Systems of San Diego, Calif.

After laser processing, a dielectric layer 21 is applied to the cell's back surface. A suitable technique for depositing such a layer without heating the wafer above 150° C. is plasma decomposition or silane and ammonia. Such a layer is resistant to etching in KOH, but etches readily in Hydrogen Fluoride. In order to reduce the possiblity of pinholes in the dielectric layer, a preferred procedure is to deposit two layers of between 1000 and 2000 Å each with a cleaning step in between. By following this procedure, any pinholes in the first film are likely to be covered by the second. By way of example, a mixture of about 20% silane in ammonia at a pressure of 200-300 mTorr, at a wafer temperature of 100° C. and a plasma power density of 50-100 mW/cm$^2$ forms a suitable dielectric layer 21.

The next step is to etch the silicon in order to gain access to the front contact from the back surface and to isolate individual cells if more than one cell is on a wafer. In the preferred embodiment, a KOH etchant is used to accomplish this. The KOH etchant is 30% concentration in water at a temperature of 80° C. The etching proceeds at about 1.5 microns per minute. The etching time depends on the cell thickness. Alternatively, a scheme such as that described in U.S. Pat. No. 4,612,408 could be used to create a high-voltage output device.

Finally contacts are opened in the back surface dielectric 21 and a reflective metal 22 is deposited and patterned to produce an ohmic contact and a back surface reflector. In a preferred embodiment, aluminum is used as the reflective metal 22 since it has a relatively high reflectivity when in contact with the dielectric 21 and it also provides a good ohmic contact. FIG. 5 is an exploded cut-away perspective view of a completed cell produced in accordance with the above description.

Although only one embodiment of the present invention has been disclosed, it should be understood that the present invention may be embodied in many other specific forms without departing from the spirit or scope of the invention. Particularly, it should be appreciated that the specific materials used, as well as the dimensions and intensities described may be widely varied to effect the purposes of the invention. Similarly, while the invention has primarily been described in relation to silicon and particularly single crystal silicon cells, it will be appreciated by those skilled in the art that other semiconductor materials including gallium arsenide (GaAs) could be used as well. Therefore, the present examples and embodiments are to be considered as illustrative and not restrictive, and the invention is not to be limited to the details given herein, but may be modified within the scope of the appended claims.

We claim:

1. A method of fabricating a solar cell from a semiconductor wafer having a top surface and a bottom surface, the wafer including an oxide layer forming said top surface, a junction layer closely adjacent the oxide layer, the junction layer having a first conductivity type, and a bulk semiconductor material having a second conductivity type opposite that of the first surface junction layer, the method comprising the steps of:

adhering a support member to the top surface of the wafer using an adhesive, the interface between the support member and the top surface of the wafer forming a bondline;

forming a doped back surface field and ohmic contact layer on the bottom surface of the supported wafer by:

depositing a layer of amorphous material containing a selected dopant on the bottom surface of the wafer, and melting the amorphous layer using a pulsed laser energy source that delivers enough energy to melt the amorphous layer, but has a low enough intensity to ensure that the bondline will not suffer thermal damage.

2. A method of fabricating a solar cell as recited in claim 1 further comprising the step of thinning the bulk layer to a width less than 50 microns after adhering the support member to the wafer.

3. A method of fabricating a solar cell as recited in claim 2 wherein the wafer is formed from Silicon.

4. A method of fabricating a solar cell as recited in claim 3 wherein said selected dopant is Boron.

5. A method of fabricating a solar cell as recited in claim 1 further comprising the step of applying a dielectric layer to the back surface of the wafer after said pulsed lasing step.

6. A method of fabricating a solar cell as recited in claim 1 wherein said support member is substantially transparent to electromagnetic radiation.

7. A method of applying a back surface layer to a solar cell formed of a semiconductor wafer, comprising the steps of:
   adhering a support member to the wafer to provide structural support for the wafer, the interface between the support member and the wafer forming a bondline;
   thinning the supported wafer to a thickness less than 100 microns;
   depositing a layer of amorphous semiconductor material containing a dopant on the bottom surface of the thinned wafer;
   exposing the amorphous layer to pulsed laser energy, the energy pulse duration being long enough to melt the amorphous material and a thin layer of wafer material adjacent the bottom surface of the thinned wafer, but short enough to prevent damage to the bondline from heating.

8. A method of fabricating a solar cell as recited in claim 7 wherein said support member is a coverglass.

9. A method of fabricating a solar cell as recited in claim 8 wherein a dielectric layer is applied to the back surface of the wafer after said pulsed lasing step.

10. A method of fabricating a solar cell from a wafer formed of a semiconductor material and having a front surface and a back surface, the semiconductor material forming a bulk layer having a selected first conductivity type, the method comprising the steps of:
    forming a front surface junction layer having a second conductivity type opposite that of the bulk layer and in contact therewith;
    adhering a transparent support member to the front surface of the wafer to provide structural support for the wafer and to admit electromagnetic radiation into the cell, the interface between the support member and the wafer forming a bondline;
    thinning the bulk layer;
    forming a doped ohmic contact layer in the bottom surface of the wafer by depositing a layer of amorphous material containing a first conductivity type dopant on said bottom surface, and melting the amorphous material using a pulsed laser energy source having an intensity high enough to melt the amorphous material and a thin layer of the semiconductor material adjacent the bottom surface, and low enough to insure that the bondline will not be damaged;
    applying a dielectric layer to the back surface of the ohmic layer, and
    forming contacts to the ohmic layer through openings formed in the dielectric layer.

11. A solar cell formed by the method of claim 10 wherein said thinning step includes thinning the wafer to a thickness of less than 50 microns.

12. A solar cell formed by the method of claim 11 wherein the wafer is formed of silicon and boron is the first dopant.

* * * * *